United States Patent [19]
Lien et al.

[11] Patent Number: 5,712,508
[45] Date of Patent: Jan. 27, 1998

[54] STRAPPING VIA FOR INTERCONNECTING INTEGRATED CIRCUIT STRUCTURES

[75] Inventors: Chuen-Der Lien, Los Altos Hills; Kyle W. Terrill, Campbell, both of Calif.

[73] Assignee: Integrated Device Technology, Inc., Santa Clara, Calif.

[21] Appl. No.: 567,649

[22] Filed: Dec. 5, 1995

[51] Int. Cl.[6] .................... H01L 23/48; H01L 23/52; H01L 29/40

[52] U.S. Cl. .................... 257/754; 257/756; 257/377; 257/393; 257/903; 257/774

[58] Field of Search .................... 257/903, 754, 257/756, 377, 393, 774

[56] References Cited

U.S. PATENT DOCUMENTS

| | | | |
|---|---|---|---|
| 5,198,683 | 3/1993 | Sivan | 257/756 |
| 5,212,399 | 5/1993 | Manning | 257/903 |

FOREIGN PATENT DOCUMENTS 92 02042  2/1992  WIPO .................... 257/903

Primary Examiner—Mahshid D. Saadat
Assistant Examiner—T. M. Arroyo
Attorney, Agent, or Firm—Skjerven, Morrill, MacPherson, Franklin & Friel

[57] ABSTRACT

A triple-poly process forms a static random access memory (SRAM) which has a compact four-transistor SRAM cell layout. The cell layout divides structures among the three layers of polysilicon to reduce the area required for each cell. Additionally, a contact between a pull-up resistor formed in an upper polysilicon layer forms a "strapping" via which cross-couples a gate region and a drain region underlying the strapping via. Pull-up resistors extend across boundaries of cell areas to increase the length and resistance of the pull-up resistors.

9 Claims, 5 Drawing Sheets

STRAPPING VIA FOR INTERCONNECTING INTEGRATED CIRCUIT STRUCTURES

BACKGROUND OF THE INVENTION

1. Field of the Invention

This invention relates to a process and structure for interconnecting different layers in an integrated circuit such as a static random access memory (SRAM).

2. Description of Related Art

SRAMs (static random access memories) are well known circuits which contain arrays of SRAM cells. FIG. 1 shows a circuit diagram of a four-transistor SRAM cell 100. SRAM cell 100 contains N channel transistors 110 and 120 and pull-up resistors 114 and 124 that control the voltages on nodes 112 and 122. Transistors 110 and 120 are cross-coupled and connect respective nodes 112 and 122 to a reference voltage Vss. In particular, transistor 110 has its gate coupled to node 122 which is the drain of transistor 120, and transistor 120 has its gate coupled to node 112 which is the drain of transistor 110. The sources of transistors 110 and 120 are connected to reference voltage Vss. Pull-up resistors 114 and 124 connect respective nodes 112 and 122 to a supply voltage Vcc.

The voltage on node 112 has two stable states which correspond to binary values of a bit. In both states, the voltage on node 122 is complementary to the voltage on node 112. When the voltage on node 112 is high (near supply voltage Vcc), transistor 120 conducts and pulls the voltage at node 122 low (near reference voltage Vss) which shuts off transistor 110 and allows pull-up device 114 to keep the voltage at node 112 high. When the voltage on node 112 is low, transistor 120 is off and pull-up device 124 pulls the voltage at node 122 high which turns on transistor 110 and keeps the voltage at node 112 low.

Pass transistors 116 and 126 connect respective nodes 112 and 122 to respective bit lines 118 and 128. Bit lines 118 and 128 couple to a column of SRAM cells a column decoder, a write circuit, and a sense amplifier (not shown). A word line 150 couples to a row decoder (not shown) and to the gates of pass transistors in a row of SRAM cells. To access SRAM cell 100, the row decoder applies a voltage to word line 150 which turns on pass transistors 116 and 126 and connects nodes 112 and 122 to bit lines 118 and 128 respectively. Once accessed, the sense amplifier reads SRAM cell 100 by sensing the voltages on nodes 112 and 122, or the write circuit writes to SRAM cell 100 by driving complementary voltages on bit lines 118 and 128.

Although SRAM cells are well known, semiconductor structures which form the SRAM cells vary in shape and construction. Typically, the layout of the features within SRAM cells and design rules which control the size of the features limit the minimum SRAM cell size. Generally, a layout and process are desired to provide a compact SRAM cell that can be formed within a small area of a semiconductor substrate because a compact SRAM cell typically reduces manufacturing costs per circuit by increasing the number of SRAM cells which can be formed on a wafer. Accordingly, compact interconnect structures for SRAM cells are desired.

SUMMARY OF THE INVENTION

In accordance with an embodiment of the invention, a triple-poly process forms three layers of polysilicon during fabrication of a static random access memory (SRAM). The triple-poly process permits a compact layout for four-transistor SRAM cells. In one layout, the first polysilicon layer forms gate regions for the transistors in the SRAM cells. A second polysilicon layer forms cross-couple interconnects and fixed voltage lines. A third polysilicon layer forms pull-up resistors. Spreading the structures of an SRAM cell over more layers reduces the area of the SRAM cells.

To compensate for the reduced dimensions of cell areas, pull-up resistors, which are formed from the third polysilicon layer, extend across the boundaries of the cell areas. Further, the pull-up resistors are not required to follow the symmetry of underlying structures. Accordingly, the pull-up resistors can be longer than would be possible if the resistors were symmetric and confined to the boundaries of a cell area.

In accordance with another aspect of the invention, strapping vias which cross-couple the gate of a first transistor in an SRAM cell and the drain of a second transistor in the SRAM cell further reduce cell area. The strapping via connects a substrate region which forms the drain to an adjacent polysilicon region which forms the gate. Typically, the strapping via is a portion of a structure such as a pull-up resistor which requires a connection to the underlying drain and gate. To create the strapping via, an opening is formed through overlying layers to expose adjacent portions of the gate region and the substrate region, and then a layer of material such as polysilicon is deposited in the opening to form a strap in contact with the gate region and the substrate region. During subsequent thermal processes, diffusion of dopants from the gate and substrate regions into polysilicon which forms the strapping via can provide a good electrical connection. Thus, the strapping via provides a compact structure which simultaneously accomplishes the goals of connecting a pull-up resistor to a node in an SRAM cell and cross-coupling transistors in the SRAM cell.

BRIEF DESCRIPTION OF THE DRAWINGS

Use of the same reference symbols in different figures indicates similar or identical items.

DETAILED DESCRIPTION OF THE PREFERRED EMBODIMENTS

A triple-poly process and efficient layout reduce the area of a static random access memory (SRAM). The triple-poly process creates three patterned layers of polycrystalline silicon (polysilicon) which form overlapping gates regions, interconnect regions, and pull-up resistors. In alternative embodiments, the first and/or second polysilicon layers can be replaced with, converted to, or coated with a silicide to increase conductivity. A first layer of doped polysilicon (or silicide) forms gate structures including word lines for the SRAM. A second layer of doped polysilicon (or silicide) forms cross-couple interconnects, pad regions, and supply lines for a supply voltage Vcc. A third polysilicon layer forms pull-up resistors and strapping vias which cross-couple gate regions and substrate regions. A metal layer, typically formed overlying the third polysilicon layer, forms bit lines and ground lines for the SRAM.

According to one aspect of the invention, a pull-up resistor for an SRAM cell extends beyond the boundaries of an area corresponding to the cell and therefore overlies a portion of a second SRAM cell. The pull-up resistor is not confined by a cell area and can be long enough to provide a desired resistance even when the cell area is small.

According to another aspect of the invention, strapping vias are formed by creating an opening which exposes regions of two different active layers in a semiconductor structure. In one embodiment of the invention, the active layers are a substrate and a polysilicon layer overlying the substrate. Undoped polysilicon such as in a portion of a pull-up resistor is deposited in the opening to form a strap that is in contact with both layers. Thermal processes after deposition of the undoped polysilicon cause diffusion of dopants from the underlying layers into the polysilicon strap. This increases the conductivity of the strapping via to a level which provides a good electrical connection between the two layers.

Figure 1:
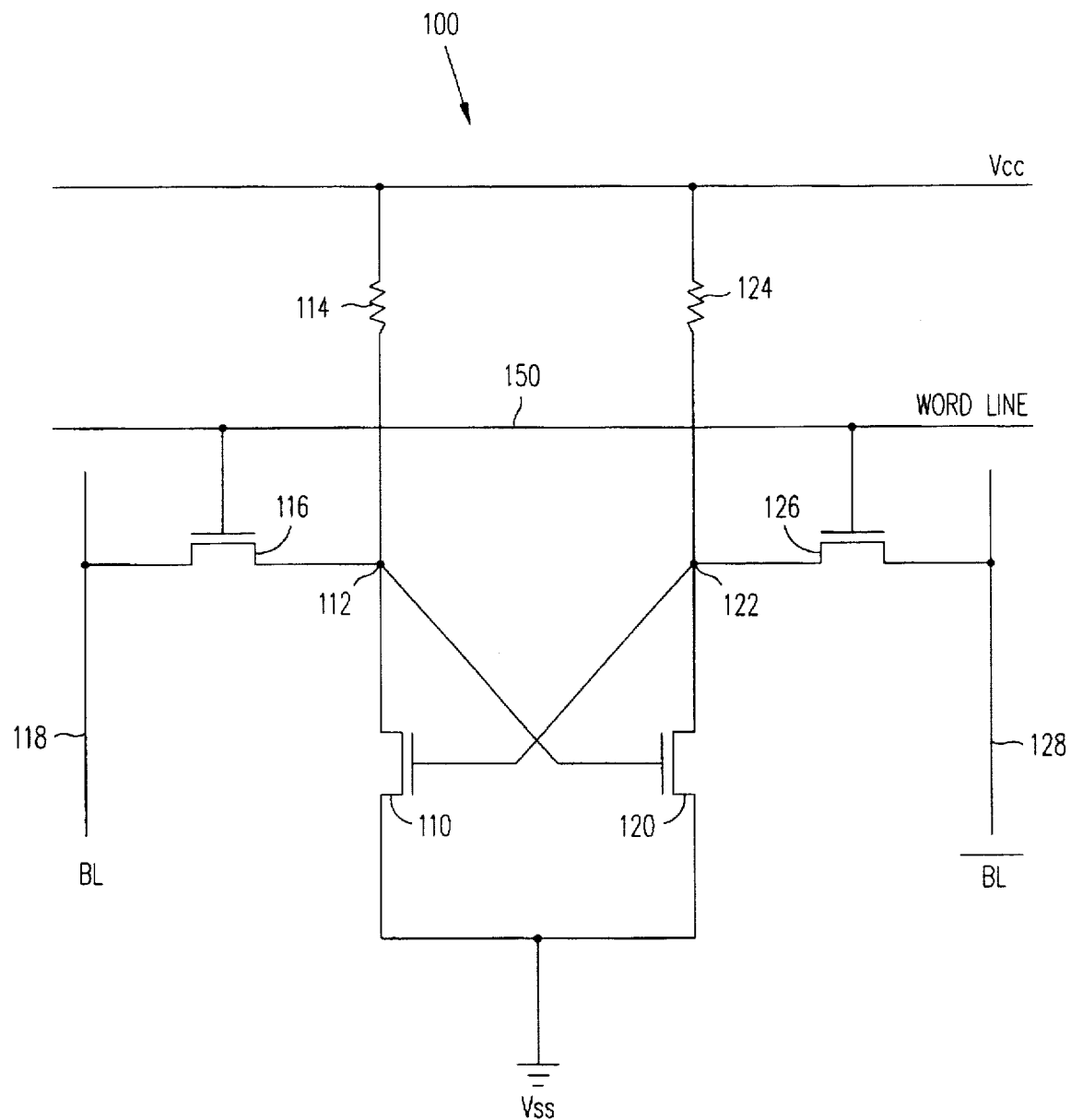
FIG. 1 shows a prior art circuit diagram of a four-transistors SRAM cell.
Figure 2:
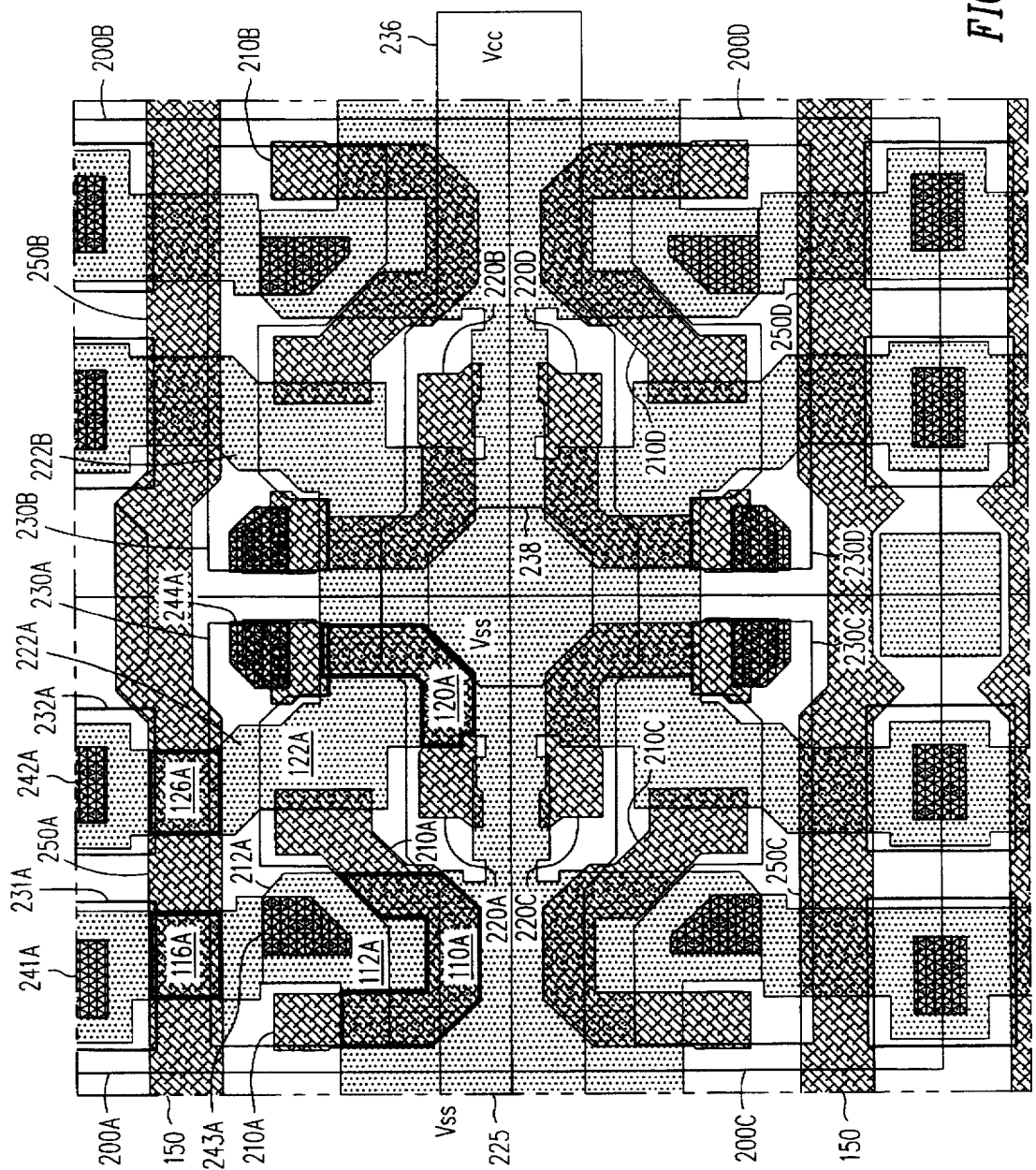
FIGS. 2, 3, and 4 show layouts of structures in a set of SRAM cells according to an embodiment of the invention.
Figure 3:
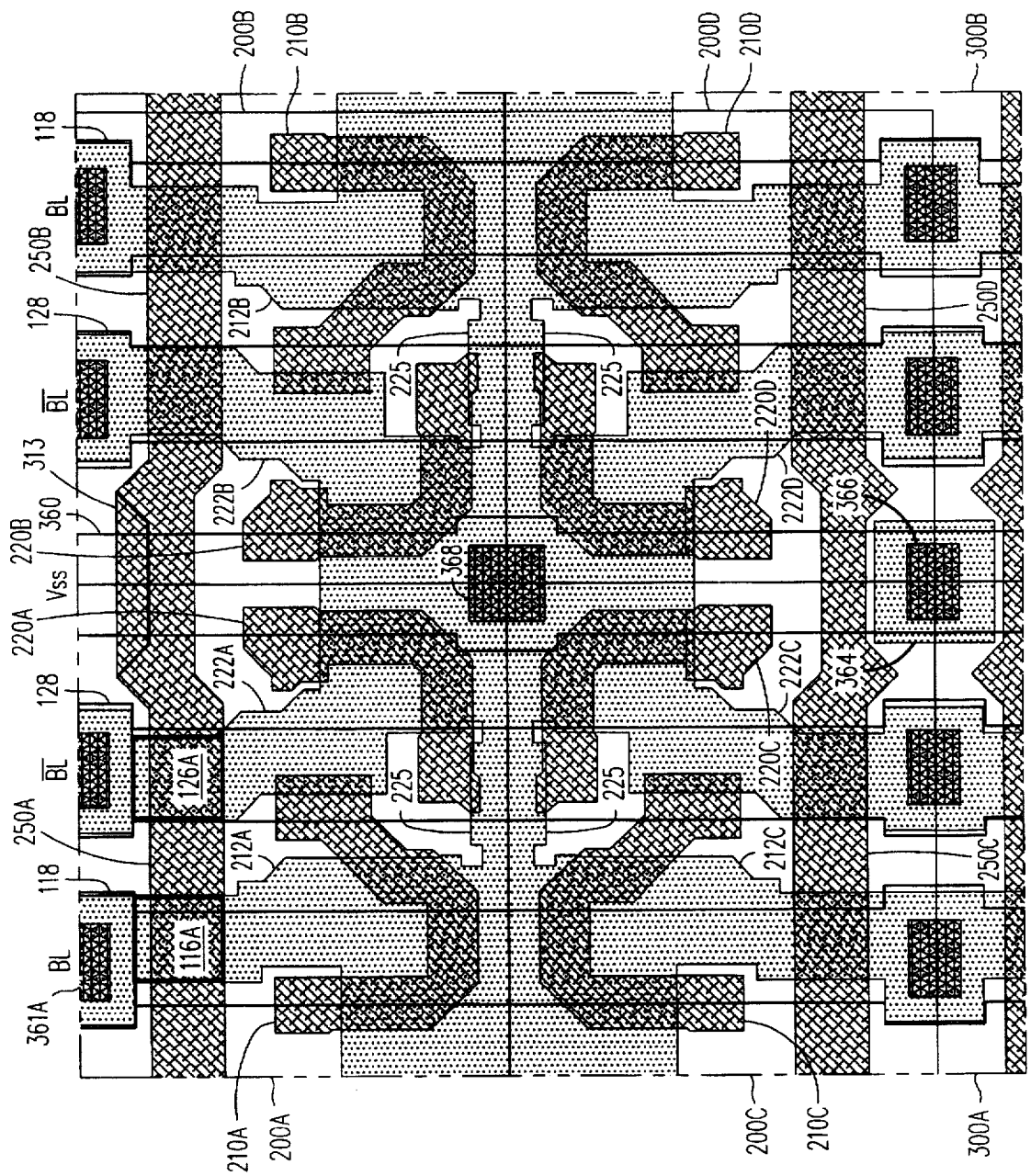
Figure 4:
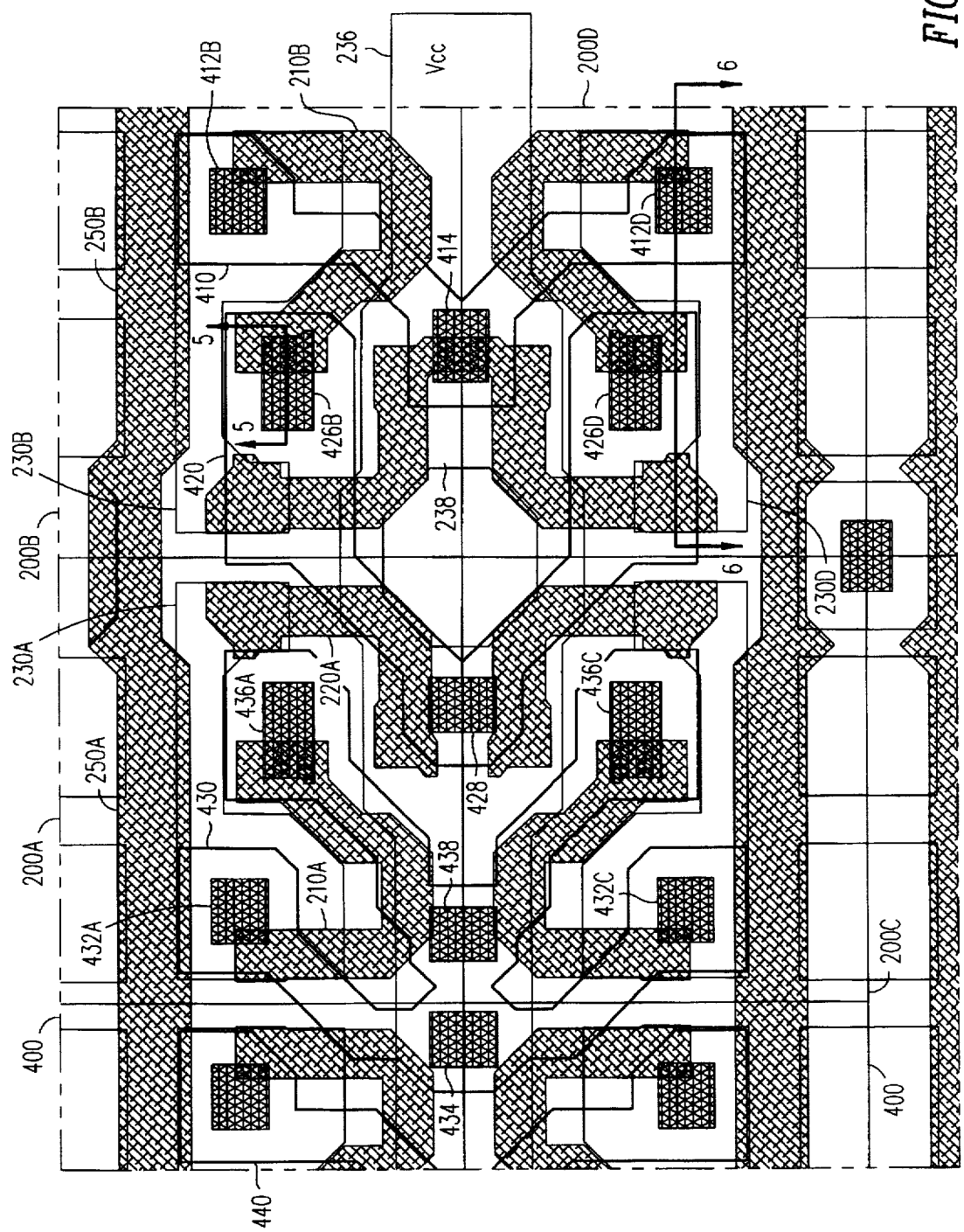

FIGS. 2, 3, and 4 show layouts for layers in four SRAM cells which are part of an integrated SRAM array containing up to a million or more SRAM cells. The four SRAM cells have respective rectangular cell areas 200A to 200D which are contiguous to each other, and the array of SRAM cells is tiled with one such rectangular area for each SRAM cell in the array. Each SRAM cell operates in the manner described above in regard to SRAM cell 100 of FIG. 1 and contains four transistors 110, 116, 120, and 126 which are formed in the area corresponding to the cell. Elements in FIGS. 2, 3, and 4 which have the same reference numerals as elements in FIG. 1 correspond to the elements of FIG. 1, and a suffix A, B, C, or D added to a reference numeral distinguishes an element or structure as part of an SRAM cell corresponding to area 200A, 200B, 200C, or 200D respectively.

The structures in areas 200A to 200B are repeated across the SRAM array so that descriptions of areas 200A to 200D also apply to the other areas of the array. Further, with the exceptions of regions formed from a third polysilicon layer shown in FIG. 4, the structures in each area 200A to 200D are substantially symmetric with corresponding structures in the other areas, and descriptions of structure in one area also apply to the other areas.

FIG. 2 shows layouts of doped regions in a silicon substrate, regions formed from a first polysilicon layer which overlies the substrate, and regions formed from a second polysilicon layer which overlies the first polysilicon layer. Regions formed from the first, the second, and a third polysilicon layer are sometimes referred to herein as poly1, poly2, and poly3 regions respectively. Other layers such as the third polysilicon layer and a metal layer which are part of the SRAM but not shown in FIG. 2 are shown in FIGS. 3 and 4. Insulating layers which separate the substrate, the first polysilicon layer, and the second polysilicon layer from each other are indicated by vias which are formed in openings through the insulating layers.

The first polysilicon layer forms word lines 150 which include regions 250A to 250D in respective area 200A to 200D. A gate oxide layer separates word lines 150 from the substrate to form gates for pass transistors 116 and 126. In particular, poly1 region 250A includes portions which form the gates of pass transistors 116A and 126A for the SRAM cell corresponding to area 200A. Adjacent to pass transistors 116A and 126A are nodes 112A and 122A which are doped regions 212A and 222A of the substrate. Nodes 112A and 122A are also the respective drains of N-channel transistors 110A and 120A. A substrate region 225 forms the sources, and poly1 regions 210A and 220A form the gates of transistors 110A and 120A.

In the embodiment of FIG. 2, poly1 region 210A extends to substrate region 222A but does not make direct electrical contact with region 222A because regions 210A and 222A do not overlap and because the gate oxide layer insulates region 210A from the underlying substrate. Typically, doping which forms substrate region 222A is after patterning the first polysilicon layer, and region 210A acts as a mask which prevents doping under region 210A. As described below, a strapping via formed from a third polysilicon layer shown in FIG. 4 forms a cross-couple interconnect between poly1 region 210A (the gate of transistor 110A) and substrate region 222A (node 122A).

A region 230A of the second polysilicon layer forms a cross-couple interconnect between region 220A (the gate of transistor 120A) and region 212A (node 112A). Vias 243A and 244A are portions of the second polysilicon layer which are deposited in openings in insulating layers and thereby provide an electrical connection from substrate region 212A through poly2 interconnect 230A to poly1 region 220A. The second polysilicon layer also forms supply line 236 which during operation of the SRAM provides supply voltage Vcc to SRAM cells in two adjacent rows of the array. Pull-up resistors formed from the third polysilicon layer connect nodes 112A and 122A to supply line 236. Supply line 236 contains an opening 238 at a corner shared by areas 200A to 200D. The opening permits formation of a via to connect substrate region 225 (the sources of transistors 110A and 120A) to a reference voltage Vss.

FIG. 3 shows the layout of the doped regions in the substrate, poly1 regions, and metal regions formed from a metal layer overlying the first polysilicon layer. To improve clarity, other layers of the SRAM structure such as the second and third polysilicon layers are not shown in FIG. 3. Substrate regions and poly1 regions shown in FIG. 3 are described in regard to FIG. 2.

The metal layer is patterned to form bit lines 118 and 128 and ground lines 360. Each bit line 118 or 128 couples to current carrying terminals (sources or drains) of pass transistors 116 and 126 in a column of SRAM cells. Adjacent SRAM cells share vias which couple pass transistors 116 and 126 to the bit lines 118 and 128. In area 200A, a via structure to pass transistor 116A includes a portion 361A of bit line 118 which is in an opening through an insulating layer to a poly2 pad region 231A (FIG. 2), and a portion 241A of poly2 pad region 231A which contacts the substrate through an opening in an underlying insulating layer.

During operation of the SRAM, each ground line 360 provides reference voltage Vss to two columns of SRAM cells. For the four SRAM cells shown in FIG. 3, ground line 360 contacts substrate region 225 through a contact 368 which passes through opening 238 in supply line 236 (FIG. 2). Substrate region 225 forms sources of four pairs of transistors 110 and 120. Ground line 360 also contacts the substrate and sets the voltage of an isolation well through a via 366 to a substrate contact region 364. Every eight SRAM cells includes one substrate contact region 364. Word line 150 in areas 200A and 200B includes a region 313 which is missing from areas 200C and 200D to accommodate substrate contact region 364 and via 366. An equal number of substrate contact regions 364 (without regions 313) per row provide word lines 150 with equal resistances.

The structures shown in areas 200A and 200B are not exactly mirror symmetric with the structures in areas 200C and 200D because of the presence or absence of region 313 and substrate contact 364. However, structures shown in FIG. 3 for areas 200A and 200C are mirror symmetric with areas 200B and 200D, and areas 200A to 200D are mirror symmetric with corresponding structures in adjacent sets four areas (not shown) which correspond to SRAM cells in the same two columns as the SRAM cells corresponding to areas 200A to 200D.

FIG. 4 shows the layout of regions of the first, second, and third polysilicon layer. To improve clarity, other layers of the SRAM such as the metal layer and the doped regions in the substrate are not shown in FIG. 4. Regions of the first and second polysilicon layers shown in FIG. 4 are described in regard to FIGS. 2 and 3. The third polysilicon layer includes poly3 regions 410, 420, and 430 which have undoped portions that form pull-up resistors for the SRAM cells corresponding to areas 200A to 200B.

Poly3 region 410 couples to supply line 236 through a via 414. A first portion of region 410 within area 200B contacts a poly2 region 230B through a via 412B and forms a pull-up device 114B for the SRAM cell corresponding to area 200B. A second portion of region 410 within area 200D contacts a poly2 region 230D through a via 412D and forms a pull-up device 114D for the SRAM cell corresponding to area 200D.

Figure 5:
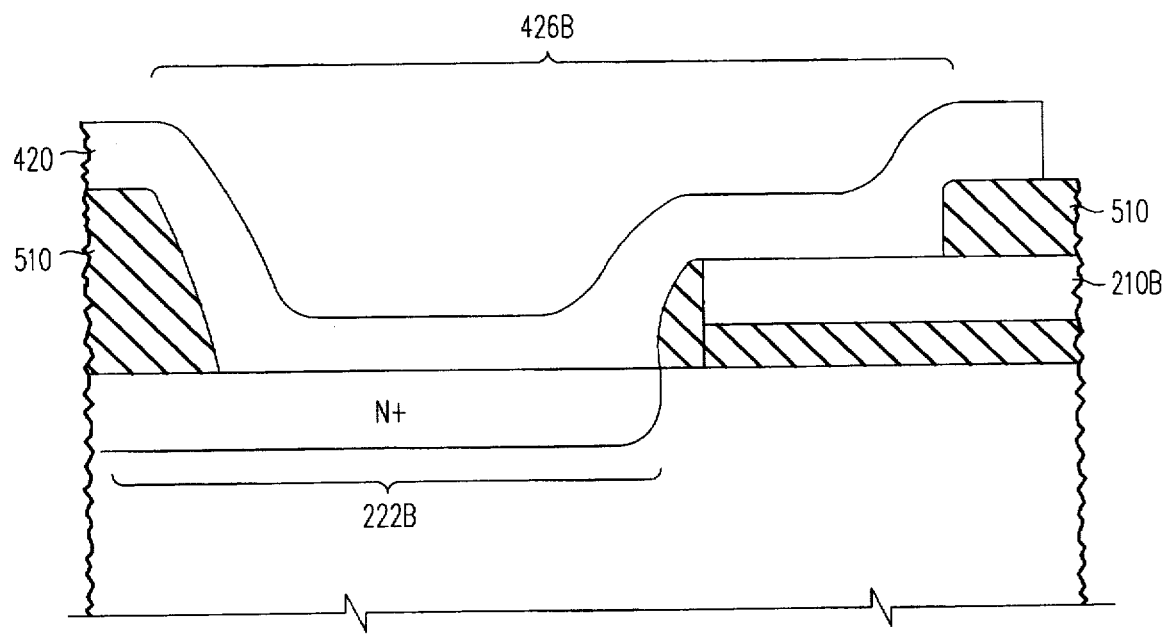
FIG. 5 shows a cross-sectional view of a strapping via in an embodiment of the invention.

Poly3 region 420 couples to supply line 236 through a via 428. A first portion of region 420 is in area 200B and contacts a poly1 region 210B and a substrate region 222B through a strapping via 426B. FIG. 5 shows a cross-sectional view of strapping via 426B. Strapping via 426B includes the portion of region 420 that is deposited in an opening through an insulating layer 510. The opening exposes a portion of substrate region 222B (node 122B) and a portion of poly1 region 210B (the gate of transistor 110B). A conducting pathway is created between substrate region 222B and poly1 region 210B either by selectively doping the third polysilicon layer so that strapping via 426 has higher conductivity than the remainder of region 420 or by thermal processes which cause diffusion from substrate region 222B and poly1 region 210B into strapping via 426B.

Strapping vias provide a compact interconnect structure because only one opening is required and the length or width of the interconnect can be as small as the minimum feature size in an integrated circuit. The minimum length of a more conventional interconnect is typically more than three times the minimum feature size, the sum of the lengths of two openings and the length of an insulating area which separates the openings. Strapping vias also provide a compact structure because a strapping via provides one structure that serves the purposes of an interconnect and a via and thereby electrically connects three different layers in an integrated circuit.

In FIG. 4, the portion of region 420 between strapping via 426B and via 428 forms a pull-up device 124B for the SRAM cell corresponding to area 200B. A second portion of region 420 forms a pull-up device 124D for the SRAM cell corresponding to area 200D and includes a strapping via 426D that contacts a poly1 region 210D and a substrate region 222D. Strapping via 426D is substantially identical to strapping via 426B.

As shown in FIG. 4, pull-up resistor 124B extends outside of area 200B and into area 200A. Extending resistor 124B outside area 200B allows resistor 124B to be longer and therefore provide greater resistance. Prior SRAM structures which confine resistors to the area of the corresponding SRAM cell limit the maximum length of the resistors. Accordingly, the width and thickness of the resistors control the resistors resistance, but the widths of the resistors are limited by the design rules to be greater than a fixed feature size. The embodiment of the invention shown in FIG. 4 permits a long pull-up resistor to increase resistance. Region 430 forms pull-up resistors for SRAM cells corresponding to areas 200A and 200C. Region 430 is not symmetric with regions 410 and/or 420. A primary reason for the asymmetry is that region 420 passes around opening 238 in supply line 236, and region 430 is not required to avoid a similar opening. Region 430 couples to supply line 236 through a via 434 and a via 438. Region 430 includes a strapping via 436A which connects substrate region 222A (node 122A) to poly1 region 210A (the gate of transistor 110A), and a portion of region 430 between strapping via 436A and via 438 forms a pull-up device 124A for the SRAM cell corresponding to area 200A. A second portion of region 430 contacts poly2 cross-couple interconnect region 230A through a via 432A and forms a pull-up device 114A for the SRAM cell corresponding to area 200A. Third and fourth portions of region 430 form pull-up resistors for the SRAM cell corresponding to area 200C. The third portion of region 430 contacts a poly1 region 210C and a substrate region 222C through a strapping via 436C and forms a pull-up device 124C. The fourth portion of region 430 contacts a poly2 cross-couple interconnect region 230C through a via 432C and forms a pull-up device 114C for the SRAM cell corresponding to area 200C.

Pull-up resistors 114A and 114C extend outside regions 200A and 200C into adjacent cell areas 400 which are in the same rows as the SRAM cells corresponding to areas 200A to 200D. Corresponding poly3 regions such as region 440 in areas 400 repeat the pattern of poly3 regions 410, 420, and 430 for each set of four cell area along a pair of row.

Figure 6:
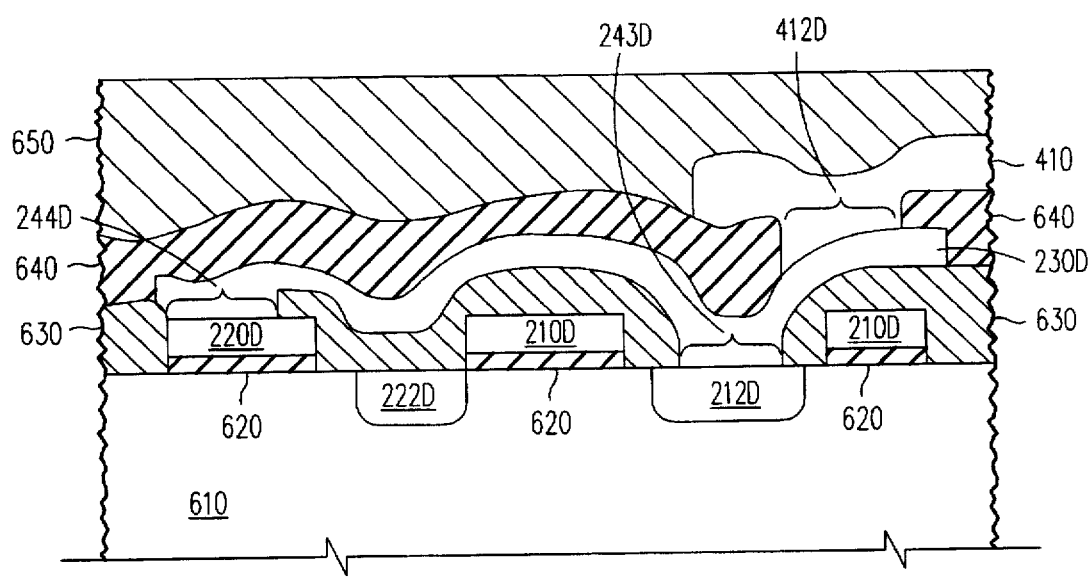
FIG. 6 shows a cross-sectional view of a portion of an SRAM cell in accordance with an embodiment of the invention.

FIG. 6 shows a cross-section of the SRAM of FIGS. 2, 3, and 4 along the line 6—6 shown in FIG. 4. The SRAM formed in and on a monocrystalline silicon substrate 610 which is initially processed in a conventional manner to form field oxide regions (not shown) and isolation wells. Well known twin-well isolation is typically used in CMOS processes to form N wells and P wells for P channel and N channel device. FIG. 6 shows a portion of substrate 610 which contains P type dopants such as boron for isolation of N channel transistors.

A gate oxide layer about 50 to 200 Å thick is grown or deposited on the surface of substrate 610, and conventional techniques such as chemical vapor deposition (CVD) deposits the first polysilicon layer to a thickness of about 1500 to 3500 Å on the gate oxide layer. The first polysilicon layer is doped with an N type dopant such as phosphorous so that the first polysilicon layer is a conducting layer having a resistance of 20 to 50 $\Omega$/square. The doping of the first polysilicon layer may be by techniques including but not limited to ion implantation, diffusion, or in situ doping. Additionally or alternatively, a metal such as nickel or tungsten may be sputtered or evaporated onto the surface of the first polysilicon layer before heating the first polysilicon layer to form a conductive silicide layer having a resistance typically lower than 20 $\Omega$/square. In alternative embodiments, the first polysilicon layer can be replaced with any conducting material suitable for forming the gates of transistors.

The first polysilicon layer and the gate oxide layer are masked and etched to form poly1 regions such as regions 210D and 220D and underlying insulating regions 620. After patterning the first polysilicon layer, substrate 610 is doped to form doped regions such as regions 212D and 222D. The doped regions may be formed using multiple masks for example to form lightly doped drain regions (not shown). Additionally, sidewall spacers can be formed on the poly1 regions before doping the substrate. Poly1 regions 210D and 220D and regions of photoresist and/or sidewall spacers (not shown) cover the areas of substrate 610 which are not affected by ion implantation or diffusion of dopants. In an exemplary embodiment, regions 212D and 222D are N type regions formed by ion implantation of phosphorous. In a CMOS process, P type substrate regions (not shown) may be formed elsewhere for fabrication of P channel devices.

After formation of substrate regions such as regions 212D and 222D, an insulating layer 630 made of a material such as silicon nitride, silicon dioxide, or glass is deposited to a thickness that could be less than 1000 Å, but is preferably about 1000 to 3000 Å thick. The insulating layer is deposited structure and structure and then masked and etched to form openings for vias. The second polysilicon layer which is about 500 to 3000 Å thick is conformally deposited over insulating layer 630 and is doped and/or silicided to increase conductivity. Alternatively, a conductive layer made of a material other than polysilicon can replace the second polysilicon layer. Portions of the second polysilicon layer in the openings through insulating layer 630 form vias such as vias 243D and 244D to poly1 regions such as region 220D and to substrate regions such as region 212D. The second polysilicon layer is then masked and etched to form poly2 regions such as cross-couple interconnect 230D.

Another insulating layer 640 made of a material such as silicon dioxide or glass is deposited over the entire structure and then masked and etched to form openings for vias to poly2 regions, poly1 regions, and substrate regions. The third polysilicon layer is deposited on insulating layer 640 and in the openings in insulating layer 640. The third polysilicon layer is a resistive layer which is either undoped or selectively doped in areas of the vias. FIG. 6 shows a via 412D to poly2 region 230D. The resistance in via 412D is not critical since via 412D connects a pull-up resistor to the remainder of an SRAM cell.

FIG. 5 shows strapping via 426B which connects a substrate region 222B to poly1 region 210B. The resistance of strapping via 426B between regions 222B and 210B needs to be low to provide a good electrical connection. Selective doping of the third polysilicon layer implants dopants in areas exposed by a mask which covers areas of the third polysilicon layer which need to be resistive and exposes areas such as via 426B where lower resistance is desired. Alternatively, the processing step required for selective doping can be omitted because substrate region 222B and poly1 region 210B which are in contact with poly3 via 426B contain dopants which diffuse into the poly3 via 426B during thermal processes which follow deposition of the third polysilicon layer. For proper doping by diffusion, the underlying regions in contact with the strapping vias contain dopants of the same conductivity type.

After the third polysilicon layer is patterned to form pull-up resistors, an insulating layer 650 is formed over the entire structure. In one embodiment of the invention, insulating layer 650 includes an undoped insulating layer such as a glass, silicon dioxide, or silicon nitride layer about 1000 Å thick and a BPSG (boron-phosphorus-silicon glass) layer about 5000 Å thick. The BPSG glass layer is annealed at a temperature of about 850° C. for approximately 30 minutes to reduce the topography of the structure. During annealing, diffusion from underlying structures increases the dopant concentration in the vias formed from the third polysilicon layer. After annealing, insulating layer 650 is further planarized, for example chemical mechanical polishing to provide a flat surface for a metal layer.

Masking and etching of insulating layer 650 forms openings for contacts from metal regions such as shown in FIG. 3 which are formed from a metal layer sputtered or evaporated onto layer 650. The metal layer is patterned to form bit lines and ground lines. Conventional passivation layer is applied over the metal, and the structure is conventionally packaged to complete the integrated SRAM.

Although the present invention has been described with reference to particular embodiments, the description is only an example of the invention's application and should not be taken as a limitation. In particular, even though the preceding discussion described specific dopant conductivity types, opposite dopant types may be employed in alternative embodiments. Various other adaptations and combinations of features of the embodiments disclosed are within the scope of the invention as defined by the following claims.

We claim:

1. An integrated circuit structure comprising:

a semiconductor substrate having a doped region that contains dopants of a first conductivity type;

a patterned layer overlying the semiconductor substrate, wherein the patterned layer includes a conducting region adjacent the doped region;

an insulating layer overlying the patterned layer, the insulating layer having an opening to a portion of the conducting region and a portion of the doped region; and a polysilicon layer having a first portion disposed in the opening to create an electrically conductive path from the conducting region to the doped region and a second portion which is undoped and forms a resistive element connected to said first portion.

2. The structure of claim 1, wherein the portion disposed in the opening contains dopants of the first conductivity type.

3. The structure of claim 2, wherein the portion of polysilicon layer in the opening contains dopants diffused from the doped region and the conducting region.

4. The structure of claim 1, wherein the conducting region comprises doped polysilicon.

5. The structure of claim 1, wherein the conducting region comprises silicide.

6. An interconnect structure for a memory cell comprising:

a semiconductor substrate which includes a doped region that forms a source/drain of a first transistor;

a patterned layer overlying the semiconductor substrate, wherein the patterned layer includes a conducting region adjacent the doped region, wherein the conducting region forms a gate of a second transistor;

an insulating layer overlying the patterned layer, the insulating layer having a single contiguous opening to a portion of the conducting region and a portion of the doped region; and a polysilicon region having a first portion disposed in the opening and on a top surface of the doped region and a second portion in the opening and on a top surface of the conducting region, wherein the first and second portions create an electrically conductive path from the conducting region to the doped region.

7. The structure of claim 6, wherein the first and second portions of the polysilicon region are doped with the same conductivity type dopants.

8. The structure of claim 7, wherein the polysilicon region further comprises a third portion which is undoped and forms a resistive element connected to the portions in the opening.

9. The structure of claim 8, wherein the first, second, and third portions of the polysilicon layer constitute a cross-couple interconnect and a pull-up resistor for the memory cell.

* * * * *